(12) United States Patent
Chang et al.

(10) Patent No.: US 8,466,817 B2
(45) Date of Patent: Jun. 18, 2013

(54) ELECTRONIC DEVICE AND METHOD FOR DRIVING AN INTERNAL FUNCTION BLOCK OF A PROCESSOR OF THE ELECTRONIC DEVICE TO OPERATE IN A LINEAR REGION

(75) Inventors: Wei-Chih Chang, Taoyuan County (TW); Yu-Peng Lai, Taoyuan County (TW); Ching-Chung Hung, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 58 days.

(21) Appl. No.: 13/282,150

(22) Filed: Oct. 26, 2011

(65) Prior Publication Data

US 2013/0111223 A1    May 2, 2013

(51) Int. Cl.
*H03M 1/10*    (2006.01)

(52) U.S. Cl.
USPC ........... 341/120; 341/118; 341/138; 341/140; 341/141; 341/142

(58) Field of Classification Search
USPC ......................... 341/118–121, 138–142, 155
See application file for complete search history.

(56) References Cited

U.S. PATENT DOCUMENTS

| | | | |
|---|---|---|---|
| 4,808,914 A | | 2/1989 | Talmor |
| 5,557,741 A * | | 9/1996 | Jones ............................... 714/43 |
| 6,289,293 B1 * | | 9/2001 | Huang .......................... 702/117 |
| 6,397,361 B1 * | | 5/2002 | Saitoh ........................... 714/724 |
| 6,560,734 B1 * | | 5/2003 | Whetsel ......................... 714/724 |
| 6,703,952 B2 * | | 3/2004 | Giddens et al. ................ 341/120 |
| 6,807,504 B2 * | | 10/2004 | Chen et al. ..................... 702/118 |
| 7,102,555 B2 * | | 9/2006 | Collins et al. .................. 341/120 |
| 7,352,169 B2 * | | 4/2008 | Abraham et al. ......... 324/762.02 |
| 7,574,318 B2 * | | 8/2009 | Hsieh ............................. 702/108 |
| 7,822,147 B2 * | | 10/2010 | Huang et al. ................... 375/296 |
| 2007/0103351 A1 * | | 5/2007 | Sutardja ......................... 341/120 |
| 2010/0126856 A1 * | | 5/2010 | Wang et al. .............. 204/403.01 |
| 2010/0244848 A1 * | | 9/2010 | Barrenscheen et al. ....... 324/500 |

* cited by examiner

*Primary Examiner* — Linh Nguyen
(74) *Attorney, Agent, or Firm* — Birch, Stewart, Kolasch & Birch, LLP

(57) ABSTRACT

An electronic device and a method for driving an internal function block of a processor of the electric device to operate in a linear region. The electronic device comprises a processor having two multiple purpose pins (MPP1 and MPP2), an external device connection port, and two resistance elements. The external device connection port is further connected to the MPP1 and at a tested voltage. The first resistance element is connected between a high level voltage and the external device connection port. The second resistance element is connected between the external device connection port and the MPP2. The processor is configured to output the high or low level voltage at MPP2 when the tested voltage is in a non-linear operating region, to guarantee the tested voltage to a linear operating region of the function block which is coupled to the MPP1 by a multiplexing design.

20 Claims, 3 Drawing Sheets

ELECTRONIC DEVICE AND METHOD FOR DRIVING AN INTERNAL FUNCTION BLOCK OF A PROCESSOR OF THE ELECTRONIC DEVICE TO OPERATE IN A LINEAR REGION

BACKGROUND OF THE INVENTION

1. Field of the Invention

The present invention relates to use of a multi-purpose pin (MPP) of a processor, and in particular relates to methods by which an analog-to-digital converter within the processor that receives an analog signal by a multi-purpose pin is operated in a linear region.

2. Description of the Related Art

To reduce the number of I/O pins of a chip and for lower costs, a multi-purpose I/O design is generally used in a processor, to achieve multiple applications by a single pin. For example, a multiplexer is used in the design of a multi-purpose I/O port, and thereby a multi-purpose pin corresponding thereto is alternatively used by several function blocks. The multi-purpose I/O design covers digital signal applications and analog signal applications.

However, in the applications of analog-to-digital conversion, the utilization of the multiplexer may compress the linear operating region of the analog-to-digital converter— for example, nonlinear operating regions such as a footroom and headroom (hereinafter, referred to as lower and upper nonlinear operating regions). In this manner, for an analog-to-digital converter designed within the processor, the operation of the analog-to-digital converter is distorted if the voltage level of the signal received that is transferred via the multi-purpose I/O design is very low and falls to the lower nonlinear operating region. Additionally, the operation of the analog-to-digital converter is also distorted in a case wherein the voltage level of the signal that is transferred via the multi-purpose I/O design is very high and up to the upper nonlinear region.

BRIEF SUMMARY OF THE INVENTION

An electronic device and a method for driving an internal function block of a processor of the electronic device to operate in a linear region are disclosed.

An electronic device in accordance with an exemplary embodiment of the invention comprises a processor, an external device connection port, a first and a second resistance element. The processor comprises a first multi-purpose pin and a second multi-purpose pin. The external device connection port is for connecting to an external device. The external device connection port is connected to the first multi-purpose pin and is at a tested voltage which is to be measured. The first resistance element has a first terminal connected to the external device connection port and has a second terminal connected to a high level voltage. The second resistance element has a first terminal connected to the external device connection port and has a second terminal connected to the second multi-purpose pin. The processor is configured to output one of the high level voltage or a low level voltage at the second multi-purpose pin when the tested voltage is in a nonlinear operating region of a function block within the processor, to guarantee the tested voltage test in a linear operating region of the function block. The function block is coupled to the first multi-purpose pin via a multiplexing design.

In another exemplary embodiment, a method for driving an internal function block of a processor to operate in a linear region is disclosed. According to the disclosed method, a first multi-purpose pin of a processor is connected to an external device connection port. The external device connection port is operative to connect to an external device and is at a tested voltage which is to be measured. Further, a first terminal of a first resistance element is connected to the external device connection port, and a second terminal of the first resistance element is connected to a high voltage level. By the disclosed method, a first terminal of a second resistance element is also connected to the external device connection port, and a second terminal of the second resistance element is connected to a second multi-purpose pin of the processor. When the tested voltage is in a nonlinear operating region of a function block within the processor, one of the high voltage level or a low voltage level is output by the second multi-purpose pin, to guarantee the tested voltage in a linear operating region of the function block. The function block is coupled to the first multi-purpose pin via a multiplexing design.

An electronic device in accordance with another exemplary embodiment comprises a processor, an external device connection port, a first resistance element and a second resistance element. The processor comprises a first multi-purpose I/O port and a first multi-purpose pin corresponding thereto, a second multi-purpose I/O port and a second multi-purpose pin corresponding thereto, a control module and an analog-to-digital converter. The control module controls the first and second multi-purpose I/O ports to set the purpose of the first and second multi-purpose pins. The analog-to-digital converter connects to the first multi-purpose I/O port and thereby receives an analog signal which is transferred to the processor via the first multi-purpose pin. The external device connection port is operative to connect to an external device and, inside the electronic device, is connected to the first multi-purpose pin. The first resistance element has a first terminal connected to the external device connection port and has a second terminal controlled at a high level voltage. The high level voltage equals to a high level state output by the second multi-purpose pin. The second resistance element is coupled between the external device connection port and the second multi-purpose pin. When the tested voltage is in a nonlinear operating region of the analog-to-digital converter, the control module further controls the second multi-purpose I/O port to output one of the high level voltage and a low level voltage, to guarantee the tested voltage in a linear operating region of the analog-to-digital converter.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
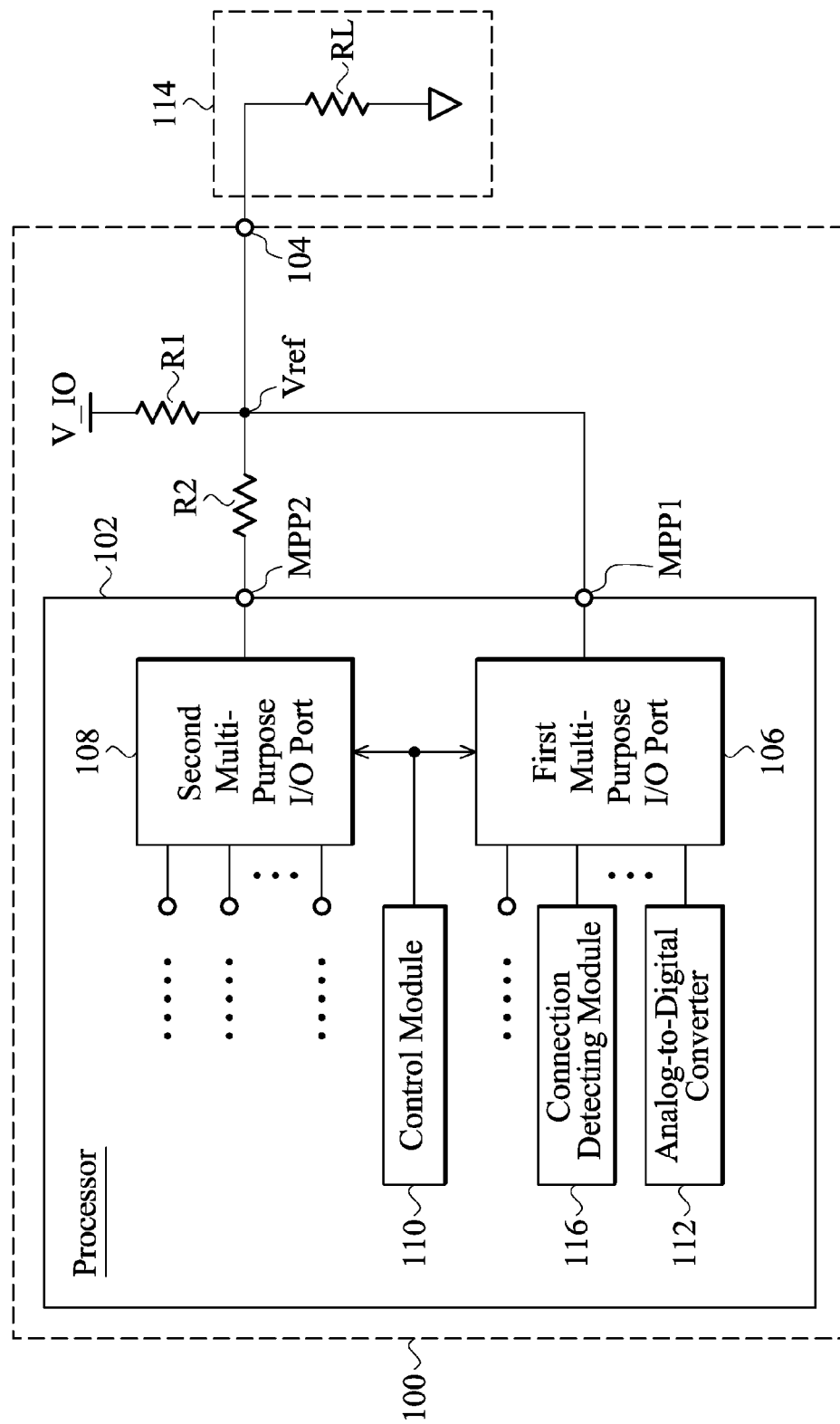
FIG. 1 illustrates an electronic device 100 in accordance with an exemplary embodiment of the invention.

FIG. 1 depicts an electronic device 100 in accordance with an exemplary embodiment of the invention. The electronic device 100 comprises a processor 102, an external device connection port (herein, simplified by a node 104), a first resistance element R1 and a second resistance element R2.

Firstly, the processor 102 is discussed. The processor 102 comprises a first multi-purpose I/O port 106 (having a multiplexer function) and a first multi-purpose pin MPP1 corresponding thereto, a second multi-purpose I/O port 108 (having a multiplexer function) and a second multi-purpose pin MPP2 corresponding thereto, a control module 110 and an analog-to-digital converter 112. The control module 110 takes charge of the control of the first and second multi-purpose I/O ports 106 and 108, to set the function of the first and second multi-purpose pins MPP1 and MPP2. The analog-to-digital converter 112 is connected to the first multi-purpose I/O port 106 and thereby receives an analog signal which is input to the processor 102 via the first multi-purpose pin MPP1. Note that the second multi-purpose pin MPP2 is not limited to digital signal applications or analog signal applications. In an exemplary embodiment, the second multi-purpose pin MPP2 may be a general-purpose pin which outputs high or low voltage level and does not require ADC function.

As for the external device connection port 104, operative to connect to an external device 114 (in this figure the external device is symbolized by a resistor RL, also known as a tested resistor which is to be tested), it is connected, inside the electronic device 100, to the first multi-purpose pin MPP1. Further, the external device connection port 104 is also connected to the first resistance element R1 while the other terminal of the first resistance element R1 is controlled at a high level voltage V_IO. The high level voltage V_IO may be equal to a high level status that the second multi-purpose pin MPP2 uses when working as an output pin. As for the second resistance element R2, it is coupled between the external device connection port 104 and the second multi-purpose pin MPP2.

Regarding the control module 110, its control over the second multi-purpose I/O port 108 includes switching the second multi-purpose pin MPP2 to be an input pin or an output pin, to ensure that the signal transferred to the analog-to-digital converter 112 via the first multi-purpose pin MPP1 is in a linear region. For the lower, or upper nonlinear analog-to-digital conversion region, the second multi-purpose pin MPP2 switched for the output purpose may output the high level status or a low level status thereof, respectively, in response thereto.

Figure 2B:
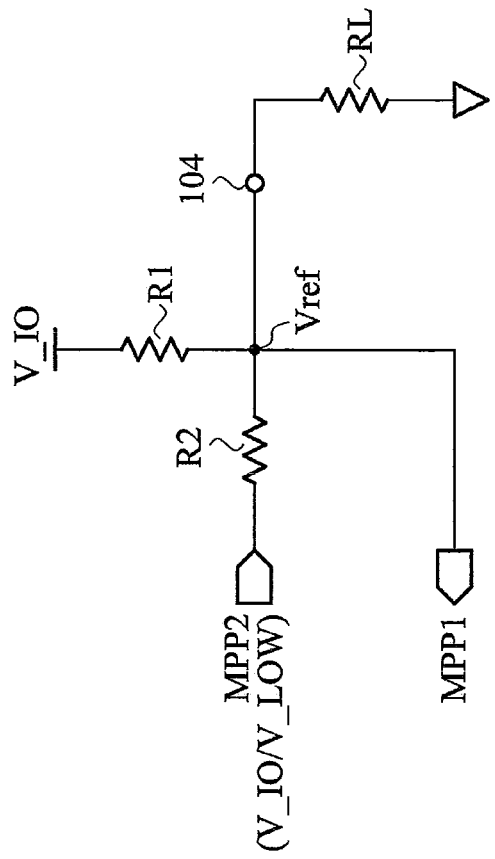
FIGS. 2A and 2B show the functional switching of the second multi-purpose pin MPP2 and illustrate how the tested voltage Vref is affected thereby.
Figure 2A:
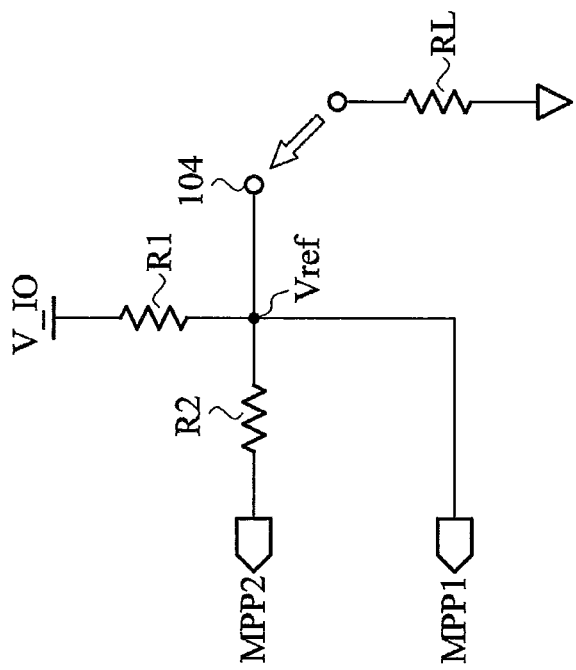

Regarding the functional switching of the second multi-purpose pin MPP2, FIG. 2A and FIG. 2B illustrate how the tested voltage Vref is affected accordingly.

Referring to FIG. 2A, the second multi-purpose pin MPP2 is for input purposes. Firstly, an example in which the external device connection port 104 is not connected to any external device (RL) is discussed. In this example, the tested voltage Vref is affected by the high level voltage V_IO and thereby is at the high level status; this information may be used to determine that the external device connection port 104 is not connected with any external device. Once the external device connection port 104 connects to an external device (RL), the first resistance element R1 and the external device (RL) form a voltage dividing circuit and the tested voltage Vref deviates from the high level voltage V_IO; this information may be used to determine that the external device connection port 104 is connected with an external device.

After confirming the link of the external device (RL), the tested voltage Vref may be checked again to determine whether the tested voltage is too high or too low to be trapped in the upper or lower nonlinear operating region of the analog-to-digital conversion. When the tested voltage Vref is in the nonlinear operating region of the analog-to-digital conversion, the second multi-purpose pin MPP2 is switched for output purposes to output the high level voltage V_IO or a low level voltage V_LOW. The low level voltage V_LOW may be equal to the voltage level coupling at the other end of the tested resistor RL of the external device.

Referring to FIG. 2B, the second multi-purpose pin MPP2 is for output purposes and outputs the high level voltage V_IO or the low level voltage V_LOW depending on conditions. When the second multi-purpose pin MPP2 outputs the high level voltage V_IO, the second resistance element R2 and the first resistance element R1 are connected in parallel, so that the structure of the voltage dividing circuit is changed. When the second multi-purpose pin MPP2 outputs the low level voltage V_LOW, the second resistance element R2 and the resistance RL of the external device are connected in parallel, so that the structure of the voltage dividing circuit is changed. In accordance with the change on the structure of the voltage dividing circuit, the tested voltage Vref is adjusted, away from the nonlinear operating region of the analog-to-digital conversion.

The resistance design of the first and second resistance elements R1 and R2 may follow the following principles.

In a first exemplary embodiment, the resistance of the first resistance element R1 may be greater than the resistance of the second resistance element R2 by a specific order of magnitude. For example, the first resistance element R1 is of 100K ohm while the second resistance element R2 is of 1K ohm; this design may be used to cope with external devices (RL) having low resistance, such as an earphone or a car kit and so on. When the second multi-purpose pin MPP2 is for input purposes, the voltage dividing circuit formed by the 100K ohm first resistance R1 and the low resistance external device (RL) makes the tested voltage Vref trapped in the low level nonlinear operating region of the analog-to-digital conversion (in one exemplary embodiment, a lower threshold value is used in determining whether the tested voltage Vref is unduly low.) To cope with this problem, the second multi-purpose pin MPP2 is switched to output the high level voltage V_IO. In this manner, the 1K ohm second resistance element R2 and the 100K ohm first resistance element R1 are coupled in parallel and the divided voltage is significantly changed, so that the tested voltage Vref is shifted from the lower nonlinear operating region of the analog-to-digital conversion and is raised to a higher level to operate the analog-to-digital converter in a linear region.

In a second exemplary embodiment, the resistance of the first resistance element R1 is lower than the resistance of the second resistance element R2 by a specific order of magnitude; for example, the first resistance element R1 is of 1K ohm while the second resistance element R2 is of 100K ohm. This design may be used to cope with external devices (RL) having high resistance. When the second multi-purpose pin MPP2 is for input purposes, the voltage dividing circuit formed by the 1K ohm first resistance element R1 and the high resistance external device (RL) raises the tested voltage Vref up to the higher nonlinear operation region of the analog-to-digital conversion, (in an exemplary embodiment, an upper threshold value is used in determining whether the tested voltage Vref is unduly high.) To cope with this problem, the second multi-purpose pin MPP2 is switched to output the low level voltage V_LOW. In this manner, the 100K ohm second resistance element R2 and the high resistance (e.g. 100K ohm) external device RL which are connected in parallel may obviously change the divided voltage and thereby the tested voltage Vref leaves the upper nonlinear operating region of the analog-to-digital conversion and falls to a lower level to operate the analog-to-digital converter in a linear region.

Or, in other exemplary embodiments, a switch on/off design is used between two resistance elements having significantly different resistances, a high level voltage (V_IO) provider and the processor 102, to decide which one of the first and the second resistance elements R1 and R2 should have the greater or the smaller resistance as needed, to be compatible to both high resistance or low resistance external devices.

Figure 3:
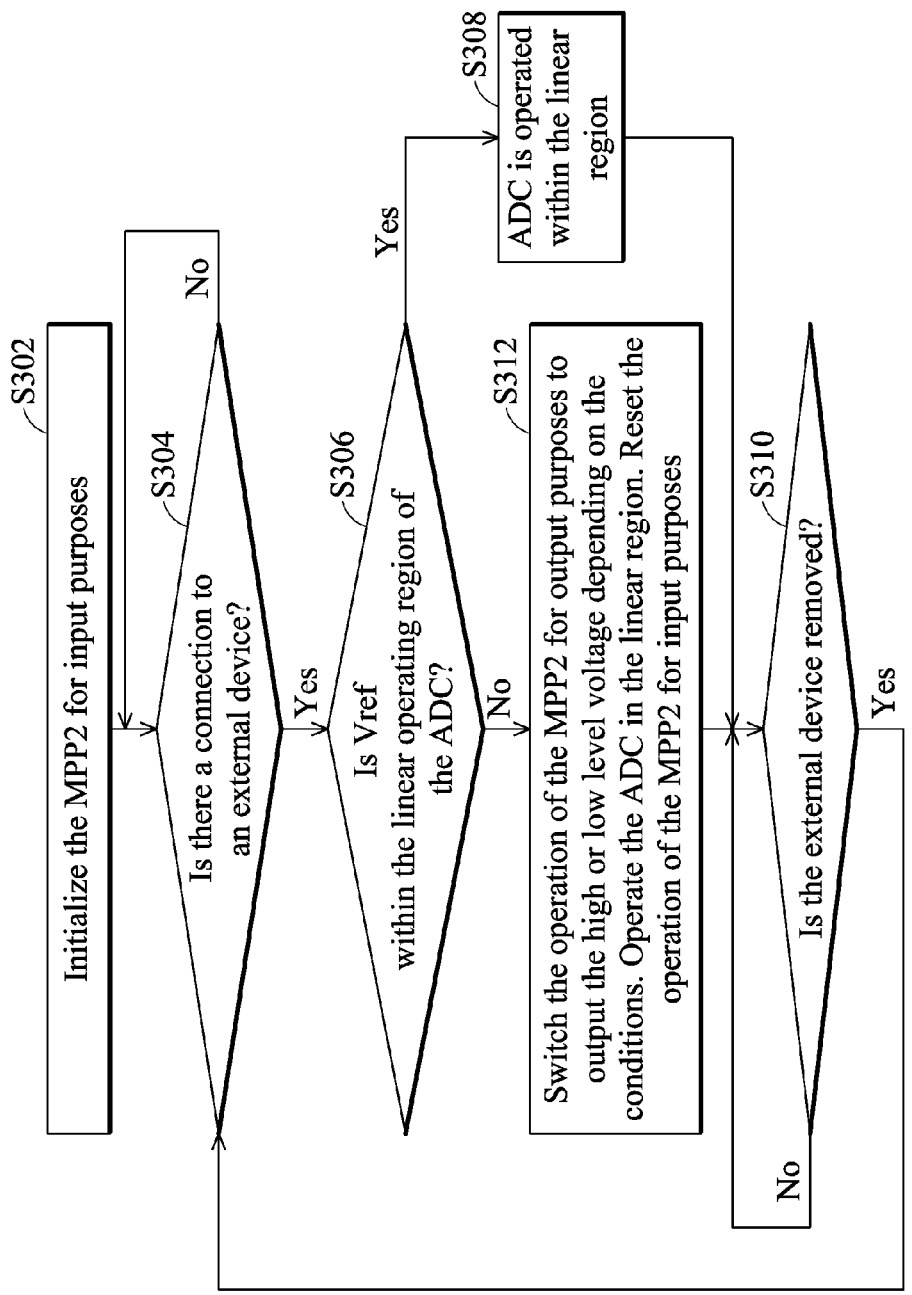
FIG. 3 shows a flowchart depicting a procedure of the functional switching of the second multi-purpose pin MPP2.

Regarding the functional switching of the second multi-purpose pin MPP2, FIG. 3 shows a flowchart in detail. In step S302, the second multi-purpose pin MPP2 is first initialized for input purposes. In step S304, the technique discussed in FIG. 2A is used to determine whether the external device connection port 104 is connected with an external device (RL). When the no external device is equipped on the port, the detection and determination step S304 is performed again. When the port is connected with an external device, the step S306 is performed to interpret the value of the tested voltage Vref for determining whether the tested voltage is in the linear operating region of the analog-to-digital conversion. When the tested voltage Vref is in the linear operating region of the analog-to-digital conversion, the step S308 is performed, and the second multi-purpose pin MPP2 is maintained as an input pin, and the analog-to-digital converter 112 is operated in a linear region. Once the demand of the analog-to-digital conversion is finished, step S310 is performed wherein the technique discussed in FIG. 2A is used to detect the removal of the external device. When it is detected that the external device has been removed, the step S304 is performed to detect the next link of the external device. When it is determined in step S306 that the tested voltage Vref is in the nonlinear operating region of the analog-to-digital conversion, step S312 is performed, and the second multi-purpose pin MPP2 is switched for output purposes to output the high or low level voltage thereof (V_IO or V_LOW) depending on the conditions, to operate the analog-to-digital converter 112 in the linear region. In step S312, the second multi-purpose pin MPP2 is further reset for input purposes when the demand for analog-to-digital conversion is finished. Then, step S310 is performed, and the technique discussed in FIG. 2A is used to detect the removal of the external device. When the removal of the external device is obtained, step S304 is performed for detecting the next link of an external device. The functional initialization, switching and reset of the second multi-purpose pin MPP2 may be accomplished by using the control unit 110 to control the second multi-purpose I/O pin 108.

In another exemplary embodiment, one path provided by the first multi-purpose I/O port 106 may couple the first multi-purpose pin MPP1 to a connection detecting module (block 116 of FIG. 1.) The connection detecting module 116 is used to implement the link detection and the removal detection of the external device which are discussed in FIG. 2A (relating to steps S304 S310 of FIG. 3) and is used in determining whether the tested voltage Vref is trapped in the lower or upper nonlinear operating regions of analog-to-digital conversion (step S306 of FIG. 3.) In this embodiment, the control module 110 controls the first multi-purpose I/O port 106 to transfer the signal at the first multi-purpose pin MPP1 to the analog-to-digital converter 112. Regarding the other steps of FIG. 3, the control module 110 controls the first multi-purpose I/O port 106 to transfer the signal at the first multi-purpose pin MPP1 to the connection detection module 116.

In an exemplary embodiment, by steps S308 and S312, the tested voltage Vref is converted to a digital value to look up a table to determine what the external device is.

The aforementioned discussion of exemplary embodiments is not intended to limit the invention to linear operation techniques of analog-to-digital converters. Using the disclosed functional switching of the second multi-purpose pin and the disclosed first and second resistance elements to adjust the signal received at the first multi-purpose pin to a linear operating region of the internal function block of a processor are considered within the scope of the invention.

For example, in another exemplary embodiment of the invention, a method for operating an internal function block of a processor in a linear region is disclosed. According to the method, a first multi-purpose pin of a processor is connected to an external device connection port wherein the external device connection port is operative to connect to an external device and is at a tested voltage to be measured. Furthermore, a first terminal of a first resistance element is coupled to the external device connection port while a second terminal of the first resistance element is connected to a high level voltage, and a first terminal of a second resistance element is connected to the external device connection port while a second terminal of the second resistance element is connected to a second multi-purpose pin of the processor. According to the method, when the tested voltage is in a nonlinear operating region of an internal function block of the processor, one of the high level voltage and a low level voltage is output by the second multi-purpose pin, to guarantee the tested voltage in the linear operating region of the function block. In this manner, the tested voltage Vref that has been transferred to the function block via the first multi-purpose pin is correctly processed. According to the disclosed method, a multiplexing function may be further introduced to the first multi-purpose pin, by which the processor first uses the processor to obtain the information about the tested voltage via the first multi-purpose pin, and the signal received via the first multi-purpose pin is not transferred to the function block until it is ensured that the tested voltage is in the liner operating region of the function block.

According to the disclosed method, the second multi-purpose pin is further initialized for input purposes. In this case, the change on the tested voltage may be further used in determining whether any external device is connected to the external device connection port. Further, according to the disclosed method, the second multi-purpose pin is rested for input purposes when the demand for the function block is finished, such that the tested voltage shows the external device link status, for the next link detection of an external device.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
a processor, comprising:
a first multi-purpose pin;
a second multi-purpose pin;
an external device connection port for connecting to an external device, wherein the external device connection port is connected to the first multi-purpose pin and is at a tested voltage that is to be measured;
a first resistance element, having a first terminal connected to the external device connection port and having a second terminal connected to a high level voltage; and
a second resistance element, having a first terminal connected to the external device connection port and having a second terminal connected to the second multi-purpose pin,
wherein, the processor is configured to:
output one of the high level voltage and a low level voltage via the second multi-purpose pin when the tested voltage is in a nonlinear operating region of a function block of the processor, to guarantee the tested voltage in a linear region of the function block, wherein, the function block is coupled to the first multi-purpose pin via a multiplexing design.

2. The electronic device as claimed in claim 1, wherein the processor is further configured to initialize the second multi-purpose pin for input purposes.

3. The electronic device as claimed in claim 2, wherein the processor is further configured to reset the second multi-purpose pin for input purposes when the operations of the function block are finished.

4. The electronic device as claimed in claim 1, wherein:
the resistance of the first resistance element is greater than that of the second resistance element by a specific order of magnitude; and
the processor is further configured to switch the purpose of the second multi-purpose pin to output the high level voltage when the tested voltage is lower than a lower threshold value.

5. The electronic device as claimed in claim 1, wherein:
the resistance of the first resistance element is lower than that of the second resistance element by a specific order of magnitude; and
the processor is configured to switch the purpose of the second multi-purpose pin to output the low level voltage when the tested voltage is greater than an upper threshold value.

6. The electronic device as claimed in claim 1, wherein the external device contains a tested resistor to be measured, wherein one terminal of the tested resistor is at a low level voltage while the other terminal of the tested resistor is connected to the external device connection port when the external device is connected to the external device connection port.

7. A method for driving an internal functional block of a processor to operate in a linear region, comprising:
using a first multi-purpose pin of the processor to connect to an external device connection port, wherein the external device connection port is for connecting to an external device and is at a tested voltage which is to be measured;
using a first terminal of a first resistance element to connect to the external device connection port, and providing a second terminal of the first resistance element with a high level voltage;
using a first terminal of a second resistance element to connect to the external device connection port, and connecting a second terminal of the second resistance element to a second multi-purpose pin of the processor; and
using the second multi-purpose pin to output one of the high level voltage and a low level voltage when the tested voltage is in a nonlinear operating region of the function block of the processor, to guarantee the tested voltage in a linear operating region of the function block, wherein the function block is coupled to the first multi-purpose pin by a multiplexing design.

8. The method as claimed in claim 7, further comprising:
initializing the second multi-purpose pin for input purposes.

9. The method as claimed in claim 8, further comprising:
resetting the second multi-purpose pin for input purposes when operations of the function block are finished.

10. The method as claimed in claim 7, wherein:
the resistance of the first resistance element is greater than that of the second resistance element by a specific order of magnitude; and
switching the purpose of the second multi-purpose pin to output the high level voltage when the tested voltage is lower than a lower threshold value.

11. The method as claimed in claim 7, wherein:
the resistance of the first resistance element is lower than that of the second resistance element by a specific order of magnitude; and
switching the purpose of the second multi-purpose pin to output the low level voltage when the tested voltage is greater than a higher threshold value.

12. The method as claimed in claim 7, wherein the low level voltage is a voltage that a first terminal of a tested resistor of the external device is coupled to, and a second terminal of the tested resistor is coupled to the external device connection port when the external device is externally connected to the external device connection port.

13. An electronic device, comprising:
a processor, comprising:
a first multi-purpose I/O port and a first multi-purpose pin corresponding thereto;
a second multi-purpose I/O port and a second multi-purpose pin corresponding thereto;
a control module, controlling the first and second multi-purpose I/O ports to set functions of the first and second multi-purpose pins; and
an analog-to-digital converter, coupled to the first multi-purpose I/O port to receive an analog signal transferred to the processor via the first multi-purpose pin;
an external device connection port, operative to connect to an external device and connect, internally inside the electronic device, to the first multi-purpose pin; a first resistance element, having a first terminal connected to the external device connection port and having a second terminal controlled at a high level voltage, wherein the high level voltage is equal to a high level status output by the second multi-purpose pin; and
a second resistance element, coupled between the external device connection port and the second multi-purpose pin,
wherein, the control module further controls the second multi-purpose I/O port to output one of the high level voltage and a low level voltage when a tested voltage is in a nonlinear operating region of the analog-to-digital converter, to guarantee the tested voltage in a linear operating region of the analog-to-digital converter.

14. The electronic device as claimed in claim 13, wherein the control module further controls the second multi-purpose I/O port to initialize the second multi-purpose pin for input purposes.

15. The electronic device as claimed in claim 14, wherein the control module further controls the second multi-purpose I/O port to reset the second multi-purpose pin for input purposes when the operations of the analog-to-digital converter are finished.

16. The electronic device as claimed in claim 13, wherein:
the resistance of the first resistance element is greater than that of the second resistance element by a specific order of magnitude; and
when the tested voltage is in a lower nonlinear operating region of the analog-to-digital converter, the control module controls the second multi-purpose I/O port to stop the second multi-purpose pin from operating for the input purpose and then switch the operation of the second multi-purpose pin to output the high level status.

17. The electronic device as claimed in claim 13, wherein:
the resistance of the first resistance element is lower than that of the second resistance element by a specific order of magnitude; and
when the tested voltage is in an upper nonlinear operating region of the analog-to-digital converter, the control module controls the second multi-purpose I/O port to stop the second multi-purpose pin from operating for the input purpose and then switch the operation of the second multi-purpose pin to output the low level status.

18. The electronic device as claimed in claim 1, wherein the second multi-purpose pin is implemented by a general-purpose pin.

19. The method as claimed in claim 7, further comprising using a general-purpose pin to implement the second multi-purpose pin.

20. The electronic device as claimed in claim 13, wherein the second multi-purpose pin is implemented by a general-purpose pin.

* * * * *